United States Patent [19]
Sachdev et al.

[11] Patent Number: 5,643,818
[45] Date of Patent: Jul. 1, 1997

[54] REMOVAL OF RESIDUES FROM METALLIC INSERT USED IN MANUFACTURE OF MULTI-LAYER CERAMIC SUBSTRATE WITH CAVITY FOR MICROELECTRONIC CHIP

[75] Inventors: Krishna G. Sachdev, Hopewell Junction; Thomas E. Lombardi; Vincent P. Peterson, both of Poughkeepsie, all of N.Y.

[73] Assignee: International Business Machines Corporation, Armonk, N.Y.

[21] Appl. No.: 642,238

[22] Filed: May 2, 1996

[51] Int. Cl.⁶ .................................................. H01L 21/70
[52] U.S. Cl. ........................... 437/51; 437/218; 437/927
[58] Field of Search ........................... 437/51, 215, 216, 437/218, 927; 148/DIG. 73

[56] References Cited

U.S. PATENT DOCUMENTS

| | | | |
|---|---|---|---|
| 2,732,612 | 1/1956 | Hallock et al. | 29/90.01 |
| 3,076,254 | 2/1963 | Ricci et al. | 29/90.01 |
| 3,760,660 | 9/1973 | VanArnam et al. | 81/9.2 |
| 3,952,389 | 4/1976 | Corder | 29/90 R |
| 4,561,214 | 12/1985 | Inoue | 51/165 R |
| 4,599,187 | 7/1986 | Hey | 252/171 |
| 4,742,024 | 5/1988 | Sugimoto et al. | 437/218 |
| 4,845,816 | 7/1989 | Nani | 29/6 |
| 5,063,712 | 11/1991 | Hamilton et al. | 51/67 |
| 5,081,067 | 1/1992 | Shimizu et al. | 437/218 |
| 5,099,558 | 3/1992 | Wilson | 29/90.01 |
| 5,162,264 | 11/1992 | Haug et al. | 437/51 |
| 5,322,398 | 6/1994 | Schmidt et al. | 408/145 |
| 5,348,913 | 9/1994 | McBride et al. | 437/209 |

FOREIGN PATENT DOCUMENTS

| | | |
|---|---|---|
| 0523892A1 | 1/1993 | European Pat. Off. . |
| 3542193C1 | 10/1986 | Germany . |
| 3834396A1 | 4/1990 | Germany . |
| 323254 | 1/1991 | Japan . |
| 50175641 | 7/1993 | Japan . |
| 04-191542 | 1/1994 | Japan . |
| 06013363 | 1/1994 | Japan . |
| 05037136 | 9/1994 | Japan . |
| 2163697 | 3/1986 | United Kingdom . |

*Primary Examiner*—Chandra Chaudhari
*Attorney, Agent, or Firm*—Dressler, Rockey, Milnamow & Katz, Ltd.

[57] ABSTRACT

After a metallic insert has been used precisely to define a cavity for a microelectronic chip in a laminated, multi-sheet, predominantly ceramic substrate having metallic features, any green sheet and metal-polymer composite paste residues are removed from the metallic insert by immersing the metallic insert in an ultrasonically agitated bath containing a first solvent having a relatively high boiling point for about five to fifteen minutes, replacing the first solvent with a second solvent having a relatively low boiling point, and drying the metallic insert in hot air or hot nitrogen to remove the second solvent. Preferably, the first solvent is an alkoxy alcohol, such as 1-methoxy-2-propanol or 3-methoxy-1-butanol, or a hydroxy ester, such as ethyl lactate, and the second solvent is a lower alkyl alcohol, such as isopropanol. Alternatively, the first solvent may be a ketone or an alkyl ester. The metallic insert is rinsed in the second solvent, preferably in an ultrasonically agitated bath, to replace the first solvent with the second solvent before the metallic insert is dried to remove the first solvent.

15 Claims, 1 Drawing Sheet

REMOVAL OF RESIDUES FROM METALLIC INSERT USED IN MANUFACTURE OF MULTI-LAYER CERAMIC SUBSTRATE WITH CAVITY FOR MICROELECTRONIC CHIP

TECHNICAL FIELD OF THE INVENTION

This invention pertains to removal of polymer-filler composite residues from a metallic insert after the metallic insert has been used in a lamination process for the manufacture of a multi-layer ceramic substrate with a cavity for a microelectronic chip. This invention provides a readily automated cleaning process for such inserts, maintaining the surface finish of the inserts, for defect-free, high reliability production with improved yield.

BACKGROUND OF THE INVENTION

In a known process for manufacturing a multi-layer ceramic substrate so as to have metallic features including wire bonding pads and so as to have a cavity for a microelectronic chip, an inorganic filler-polymer composite slurry is prepared by dispersing inorganic particulates, typically alumina and silica, and organic vehicles, which include polymeric binders, such as polyvinylbutyral, plasticizers, and suitable solvents. After being ball milled, the resultant slurry is tape cast on a continuous casting machine to form green (unfired) sheets.

After being dried to remove the solvents, the sheets are blanked to the appropriate size. After blanking, the sheets are punched to form vias, each approximately five mils in diameter, whereupon lasers are used to cut individual cavity apertures in some or all of the sheets. Alternatively, individual cavity apertures are punched in some or all of the sheets when the sheets are punched to form vias.

Thereupon, the sheets are screened with a metal-polymer composite paste, which forms metallic features including electrical lines and wire bonding pads on the sheets and which fills the vias. The metal-polymer composite paste is prepared from a metallic powder and organic vehicles including a polymeric binder, a surfactant, and a solvent. An example of the metal-polymer composite paste is molybdenum-filled ethylcellulose.

After screening, the metallized sheets are dried in a forced-air oven. After drying, the sheets are stacked on one another in a suitable order so that the apertures in the stacked sheets define the cavity generally, and a metallic insert is inserted into each of the generally defined cavities in the stacked sheets. The metallic insert may be also called a metallic plug. After the metallic insert is inserted into each of the generally defined cavities, the stacked sheets are laminated at a sufficiently high pressure and at a sufficiently high temperature, so that interlayer bonding occurs due to softening of the binder, to form a green (unfired) laminate and to remove the volatile solvent. After the green laminate is formed, the metallic insert in each cavity is removed, and the green laminate is diced into individual substrates, which are sintered. In subsequent steps, microelectronic chips are mounted in the cavities in the individual substrates, and wire bonding techniques are used to bond electrodes on the chips electrically to wire bonding pads in the cavities. The individual substrates are known also as cavity substrates.

As a practical necessity, because a metallic insert is an expensive, precisely made element, it must be reused. A metallic insert must be cleaned thoroughly to remove any ceramic green sheet and metal-polymer paste residues, so that it can be reused. It is important that the cleaning process assures complete removal of any adhering residues before reuse, for effective manufacturing. It also is important that the cleaning process maintains the surface finish of a metallic insert, which may have a protective coating, when the metallic insert is cleaned.

According to this invention, an effective method is provided for removing ceramic green sheet and metal-polymer paste residues from a metallic insert while maintaining the surface finish of the metallic insert.

SUMMARY OF THE INVENTION

This invention provides a method for simultaneous removal of ceramic green sheet residue and metal-polymer composite paste residue from the surface of a metallic insert used in the lamination process for the manufacture of a cavity substrate. This invention provides such a method that causes no corrosion or other detrimental effects on the protective coatings of the metallic inserts and that can employ environmentally safe, non-toxic, non-flammable solvents.

This invention provides a readily automated method for removing any ceramic green sheet and metal-polymer paste residues from a metallic insert while maintaining the surface finish of the metallic insert, as an adjunct to manufacturing a multi-layer, predominantly ceramic substrate so as to have a cavity for a microelectronic chip and so as to have metallic features. The method according to this invention employs a two-step solvent treatment using two different solvents. A first solvent having a relatively high boiling point is substantially effective in removing the ceramic green sheet and metal-polymer composite paste residues. A second solvent having a relatively low boiling point is primarily used to accelerate a subsequent drying step.

According to one mode for carrying out this invention, the metallic insert is cleaned by immersing the metallic insert in a bath containing the first solvent and agitating the bath containing the first solvent, so as to remove simultaneously any ceramic green sheet and metal-polymer composite paste residues. Thereupon, the first solvent is removed from the metallic insert and is replaced with the second solvent by rinsing the metallic insert in the second solvent. Finally, the metallic insert is dried to remove the second solvent. As examples, the first solvent may be methoxyproponal, methoxybutanol, or ethyl lactate, and the second solvent may be isopropanol or ethanol, isopropanol being preferred. Alternatively, as explained below, other solvents may be used for the first and second solvents.

According to another mode for carrying out this invention, the metallic insert is cleaned by immersing the metallic insert in a bath containing the first solvent and agitating the bath containing the first solvent, so as to remove any metal-polymer composite paste residues, and by immersing the metallic insert in a bath containing the second solvent and agitating the bath containing the second solvent, so as to remove any ceramic green sheet residues. As examples, the first solvent may be a solvent selected from aromatic hydrocarbons such as xylenes, toluene, petroleum solvents, methyl naphthalenes, ketones such as acetone and 4-methyl-2-pentanone, and esters such as n-butylacetate and ethylacetate, and the second solvent may be isopropanol.

Generally, it has been found that bi-functional solvents exemplified by 1-methoxy-propanol, 3-methoxy-1-butanol, and hydroxy esters, particularly ethyl lactate, are effective in removing both polyvinylbutyral-based ceramic green sheet residues and ethylcellulose-based metal-polymer composite paste residues. Additionally, it has been found that aromatic hydrocarbons such as xylenes, toluene, petroleum solvents, methyl naphthalenes, and esters such as n-butylacetate and ethylacetate are effective in removing metal-polymer composite paste residues but are less effective in removing ceramic green sheet residues, for which alkyl alcohols with six or fewer carbon atoms, such as isopropanol, butanol, ethanol, and methanol, provide effective cleaning. Ketones, such as acetone and 4-methyl-2-pentanone, can be also used in removing both ceramic green sheet residues and metal-polymer composite paste residues, but these are not preferred because of their high flammability.

Among the various solvents noted above, 3-methoxy-1-butanol has a boiling point of 135° C. and a flash point of 46° C., 1-methoxy-2-propanol has a boiling point of 118°–119° C. and a flash point of 33° C., ethyl lactate has a boiling point of 154° C. and a flash point of 48° C. Moreover, isopropanol has a boiling point of 82° C. and a flash point of 22° C., mixed xylenes have boiling points of 137°–144° C. and a flash point of 29° C., and 4-methyl-2-pentanone has a boiling point of 117°–118° C. and a flash point of 13° C. All stated temperatures are approximate.

Either mode discussed above may be readily automated in a multi-tank ultrasonic bath with agitation capability, one micron filtration, process timers, and a heat exchanger for maintaining bath temperatures, as required by the ultrasonic cavitation window. Such an automated cleaning method according to this invention provides consistent cleaning of metallic inserts, causes no damage to the insert surfaces, and is especially useful for high volume production.

The metallic insert may be rinsed by immersing it in a bath containing the second solvent and agitating the bath containing the second solvent. The metallic insert may be presoaked in the bath containing the first solvent before the bath containing the first solvent is agitated, preferably ultrasonically. The metallic insert may be blow-dried in hot air or hot nitrogen.

It is necessary that the metallic insert be perfectly dry prior to use, as residual solvent may cause so-called "paste pull" resulting in defects in the laminates. Since the first solvent has a relatively high boiling point, it is harder to remove the first solvent by drying the metallic insert. As contemplated by this invention, the first solvent is replaced with the second solvent, which is easier to remove by drying the metallic insert because the second solvent has a relatively low boiling point.

These and other objects, features, and advantages of this invention are evident from the following description of a preferred mode for carrying out this invention with reference to the accompanying drawings.

DETAILED DESCRIPTION OF THE PREFERRED EMBODIMENT

Figure 1:
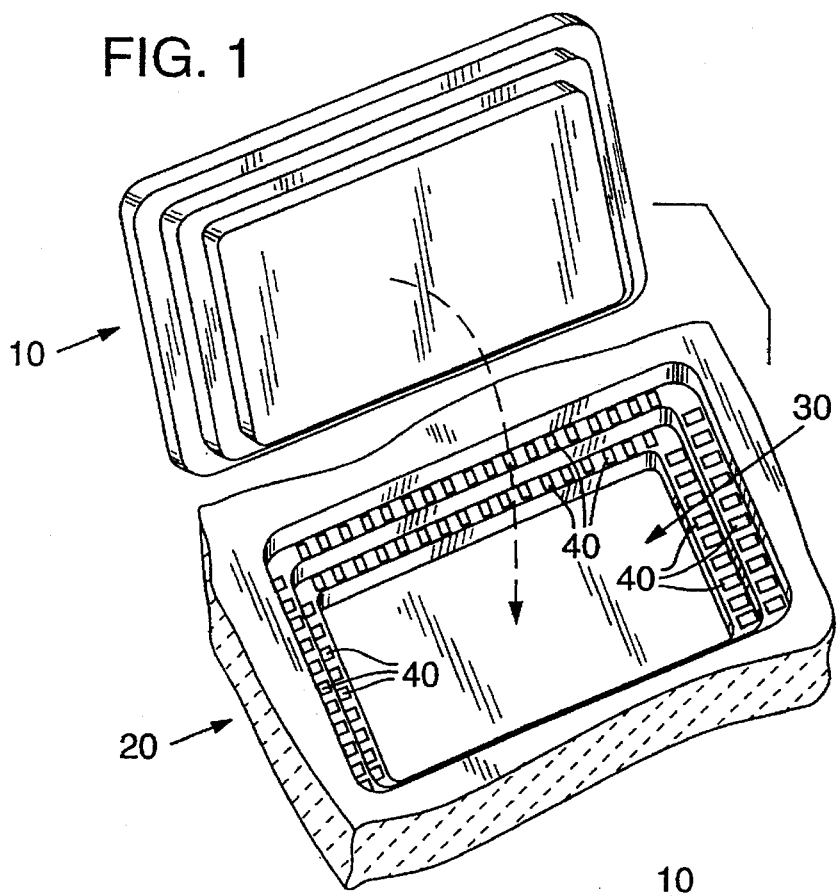
FIG. 1 is an exploded, perspective view of a predominantly ceramic substrate and a metallic insert, as used in the preferred mode for carrying out this invention.
Figure 2:
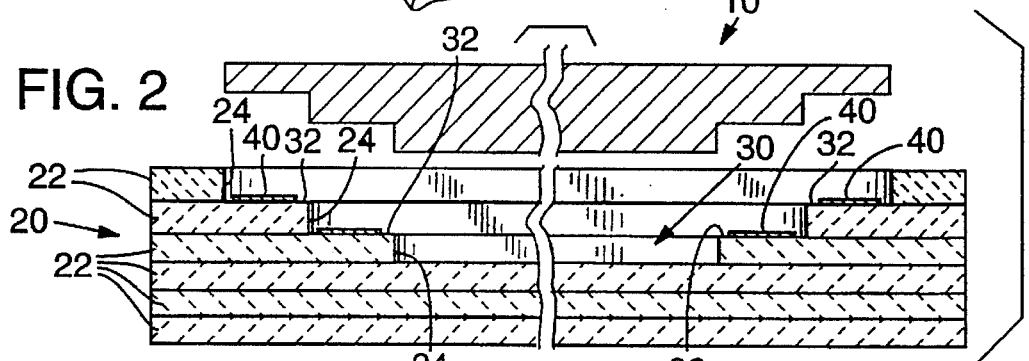
FIG. 2, on a larger scale, is a sectional view taken along a vertical plane, through the stacked sheets used to make the predominantly ceramic substrate and through the metallic insert, before the stacked sheets are laminated.
Figure 3:
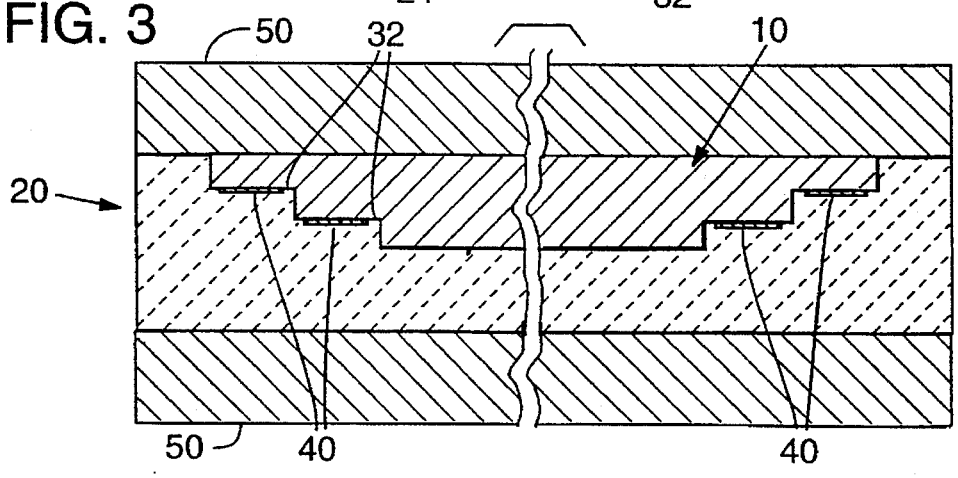
FIG. 3, on the same scale, is a sectional view taken along a vertical plane, through the stacked sheets used to make the predominantly ceramic substrate and through the metallic insert, after the stacked sheets are laminated.

A metallic insert 10 is used in manufacturing a multi-layer, predominantly ceramic substrate 20, by the known process discussed above, so as to have a cavity 30 for a microelectronic chip (not shown) and so as to have metallic features 40. The metallic insert 10 is made from a suitable metal, which may be magnetizable, and which may have a protective coating. Details of the metallic insert 10 and details of such manufacturing process are outside the scope of this invention. As an adjunct to such manufacturing process, this invention provides a readily automatable method for removing any ceramic green sheet and metal-polymer composite paste residues from the metallic insert 10 while maintaining the surface finish of the metallic insert 10.

As discussed above, the multi-layer, predominantly ceramic substrate is made by laminating ceramic green (unfired) sheets 22 made from an inorganic filler-polymer slurry. As shown, some of the green sheets 22 are screened with a metallic paste comprising a metallic powder and a polymeric binder to provide metallic features 40. As an example, the ceramic green sheets may be made from an alumina-polyvinylbutyral slurry, and the metal-polymer composite paste may be molybdenum-filled ethylcellulose.

Some of the ceramic green sheets 22 are formed, as by punching or laser cutting, with apertures 24 of progressively differing sizes. The ceramic green sheets 22 are stacked on one another so that the apertures 24 define the cavity 30 generally, whereupon the metallic insert 10 is inserted into the apertures 24. As shown, the metallic insert 10 and the cavity 30 have complementary, stepped configurations. Thus, the cavity 30 is defined partly by steps 32, into which at least some of the metallic features 40 are embedded when the green sheets 22 are laminated.

After the metallic insert 10 is inserted into the apertures 24, the green sheets 22 are laminated between platens 50, under high pressure (e.g. greater than approximately 3000 psi) so as to compress the stacked sheets 22 against the metallic insert 10, which defines the cavity 30 precisely. After the green sheets 22 are laminated, the metallic insert 10 is removed from the cavity 30. If the metallic insert 10 is made from a magnetizable metal, the metallic insert 10 is removed by a magnetic bar.

After the metallic insert 10 is removed from the cavity 30, the metallic insert 10 is subjected to the cleaning method provided by this invention. The improved method employs two different solvents, namely a first solvent having a relatively high boiling point and a second solvent having a relatively low boiling point. Herein, "relatively high" and "relatively low" are comparative terms.

In a preferred mode for carrying out this invention, the first solvent is operative to remove both ceramic green sheet residues and metal-polymer composite paste residues in a cleaning step, and the second solvent is operative to remove the first solvent in a rinsing step. In the rinsing step, the second solvent, which is easier to remove by drying, replaces the first solvent, which is harder to remove by drying.

In an alternative mode for carrying out this invention, the first solvent is effective for removing metal-polymer composite paste residues in a first cleaning step, the second solvent is effective to remove ceramic green sheet residues is a second cleaning step, and the second solvent is operative to remove the first solvent in a rinsing step. The first cleaning step and the second cleaning step can be alternatively performed in a reverse order. In the rinsing step, the second solvent, which is easier to remove by drying, replaces the first solvent, which is harder to remove by drying.

Any residue of the first or second solvent may cause the metallic insert 10 to be unsuitable to be reused. Since the first solvent has a relatively high boiling point, it is harder to remove the first solvent by drying the metallic insert 10. As contemplated by this invention, the first solvent is removed from the metallic insert 10 and is replaced with the second solvent, in a manner described below. Because the second solvent has a relatively low boiling point, it is easier to remove the second solvent by drying the metallic insert 10.

Preferably, the first solvent is selected from alkoxy alcohols, hydroxy esters, such as ethyl lactate, ketones, and alkyl esters. Alkoxy alcohols useful as the first solvent include 3-methoxy-1-butanol and 1-methoxy-2-propanol. It is preferred to use 3-methoxy-1-butanol or ethyl lactate. Alternatively, the first solvent may be n-butylacetate, methylisobutylketone, or methylethylketone. It is preferred to select the first solvent from alkoxy alcohols, hydroxy esters, ketones, and alkyl esters for reasons of volatility, flammability, toxicity, and safety. As an alternative, the first solvent may be a substantially nonpolar solvent, such as an aromatic hydrocarbon selected from xylenes, terpenes, and methyl naphthalenes.

Preferably, the second solvent is an alkyl alcohol with six or fewer carbon atoms. Isopropanol is most preferred as the second solvent.

The metallic insert 10 may be presoaked in the first solvent for at least several minutes. In the preferred mode for carrying out this invention, whether or not presoaked, the metallic insert 10 is cleaned by immersing the metallic insert 10 in a bath containing the first solvent and agitating the bath containing the first solvent ultrasonically for at least approximately five minutes, preferably for approximately five to fifteen minutes. Ordinarily, approximately five to seven minutes should suffice.

Thereupon, the metallic insert 10 is removed from the bath containing the first solvent, and the first solvent is replaced by the second solvent by rinsing the metallic insert 10 in the second solvent. Preferably, the metallic insert 10 is rinsed in the second solvent by immersing the metallic solvent 10 in a bath containing the second solvent and agitating the bath containing the second solvent for at least approximately one minute, preferably for approximately two to five minutes. Ordinarily, approximately two to three minutes should suffice.

Thereupon, the metallic insert 10 is removed from the bath containing the second solvent, and the metallic insert 10 is dried. Preferably, the metallic insert 10 is dried by blowing hot air, at approximately 80° C. Alternatively, the metallic insert 10 is blow-dried with hot nitrogen, at approximately 80° C.

As a possible modification of the cleaning method described above, the bath containing the first solvent may contain a mixture of the first and second solvents. After being cleaned in such a mixture, a metallic insert should be nonetheless rinsed in the second solvent to remove the first solvent.

In a first example, used metallic inserts having both polyvinylbutyral-based ceramic residues and ethylcellulose-based molybdenum paste residues were cleaned by successive steps of ultrasonic agitation in 3-methoxy-1-butanol for approximately seven minutes at a bath temperature between approximately 50° C. and approximately 55° C. and ultrasonic agitation in isopropanol for approximately two minutes at a similar temperature, whereupon such metallic inserts were blown dry with hot nitrogen at approximately 75° C.

In a second example, used metallic inserts having both polyvinylbutyral-based ceramic residues and ethylcellulose-based molybdenum paste residues were cleaned by successive steps of ultrasonic agitation in ethyl lactate for approximately seven minutes at a bath temperature between approximately 50° C. and approximately 55° C. and ultrasonic agitation in isopropanol for approximately two minutes at a similar temperature, whereupon such metallic inserts were blown dry with hot nitrogen at approximately 75° C.

In a third example, used metallic inserts having both polyvinylbutyral-based ceramic residues and ethylcellulose-based molybdenum paste residues were cleaned by successive steps of ultrasonic agitation in 1-methoxy-2-propanol for approximately eight to ten minutes at a bath temperature between approximately 50° C. and approximately 55° C. and ultrasonic agitation in isopropanol for approximately two minutes to five minutes at a similar temperature, whereupon such metallic inserts were blown dry with hot nitrogen at approximately 75° C.

In a fourth example, used metallic inserts having both polyvinylbutyral-based ceramic residues and ethylcellulose-based molybdenum paste residues were cleaned by successive steps of ultrasonic agitation in xylene (mixed xylenes or para-xylene) for approximately six to eight minutes at a bath temperature of approximately 45° C., ultrasonic agitation in isopropanol for approximately three minutes at a similar temperature, and rinsing with isopropanol for approximately one minute, whereupon such metallic inserts were blown dry with hot nitrogen at approximately 75° C.

In another possible example, used metallic inserts having both polyvinylbutyral-based ceramic residues and ethylcellulose-based molybdenum paste residues are cleaned as in the fourth example noted above, except that the steps of ultrasonic agitation in xylene and ultrasonic agitation in isopropanol are interchanged.

Various other modifications may be made in the cleaning method described above without departing from the scope and spirit of this invention.

We claim:

1. As an adjunct to manufacturing a predominantly ceramic substrate so as to have a cavity for a microelectronic chip and so as to have metallic features by laminating green sheets made from an inorganic filler-polymer composite slurry comprising inorganic particulates and a polymeric binder, wherein at least some of the green sheets are provided with metallic features made from a metal-polymer composite paste comprising a metallic powder and a polymeric binder, wherein at least some of the green sheets are formed with apertures, wherein the green sheets are stacked on one another so that the apertures define the cavity generally, wherein the stacked sheets are laminated under pressure after a metallic insert is inserted into the apertures so as to compress the stacked sheets against the metallic insert, which defines the cavity precisely, when the stacked sheets are laminated, and wherein the metallic insert is removed from the cavity after the stacked sheets are laminated, a method for removing any green sheet and metal-polymer composite paste residues from the metallic insert while maintaining the surface finish of the metallic insert by (a) cleaning the metallic insert by immersing the metallic insert in a bath containing a first solvent having a relatively high boiling point and agitating the bath containing the first solvent, (b) removing the first solvent from the metallic insert and replacing the first solvent with a second solvent having a relatively low boiling point by rinsing the metallic insert in the second solvent, and (c) drying the metallic insert to remove the second solvent.

2. The method for removing any green sheet and metal-polymer composite paste residues from the metallic insert while maintaining the surface finish of the metallic insert, as claimed in claim 1, wherein the first solvent is selected from alkoxy alcohols, hydroxy esters, ketones, and alkyl esters and wherein the second solvent is an alkyl alcohol with six or fewer carbon atoms.

3. The method for removing any green sheet and metal-polymer composite paste residues from the metallic insert while maintaining the surface finish of the metallic insert, as claimed in claim 2, wherein the first solvent is 1-methoxy-2-propanol and the second solvent is isopropanol.

4. The method for removing any green sheet and metal-polymer composite paste residues from the metallic insert while maintaining the surface finish of the metallic insert, as claimed in claim 2, wherein the first solvent is 3-methoxy-1-butanol and the second solvent is isopropanol.

5. The method for removing any green sheet and metal-polymer composite paste residues from the metallic insert while maintaining the surface finish of the metallic insert, as claimed in claim 2, wherein the first solvent is ethyl lactate and the second solvent is isopropanol.

6. The method for removing any green sheet and metal-polymer composite paste residues from the metallic insert while maintaining the surface finish of the metallic insert, as claimed in claim 2, wherein the bath is agitated ultrasonically for at least about five minutes.

7. The method for removing any green sheet and metal-polymer composite paste residues from the metallic insert while maintaining the surface finish of the metallic insert, as claimed in claim 2, wherein the metallic insert is rinsed by immersing the metallic insert in a bath containing the second solvent and agitating the bath containing the second solvent.

8. The method for removing any green sheet and metal-polymer composite paste residues from the metallic insert while maintaining the surface finish of the metallic insert, as claimed in claim 2, wherein the metallic insert is blown dry in hot air or hot nitrogen.

9. The method for removing any green sheet and metal-polymer composite paste residues from the metallic insert while maintaining the surface finish of the metallic insert, as claimed in claim 2, wherein the bath contains a mixture of the first and second solvents.

10. As an adjunct to manufacturing a predominantly ceramic substrate so as to have a cavity for a microelectronic chip and so as to have metallic features by laminating green sheets made from an inorganic filler-polymer composite slurry comprising inorganic particulates and a polymeric binder, wherein at least some of the green sheets are provided with metallic features made from a metal-polymer composite paste comprising a metallic powder and a polymeric binder, wherein at least some of the green sheets are formed with apertures, wherein the green sheets are stacked on one another so that the apertures define the cavity generally, wherein the stacked sheets are laminated under pressure after metallic insert is inserted into the apertures so as to compress the stacked sheets against the metallic insert, which defines the cavity precisely, when the stacked sheets are laminated, and wherein the metallic insert is removed from the cavity after the stacked sheets are laminated, a method for removing any green sheet and metal-polymer composite paste residues from the metallic insert while maintaining the surface finish of the metallic insert by (a) cleaning the metallic insert by immersing the metallic insert in a bath containing a first solvent having a relatively high boiling point and agitating the bath containing the first solvent, (b) cleaning the metallic insert by immersing the metallic insert in a bath containing a second solvent having a relatively high boiling point and agitating the bath containing the second solvent, (c) removing the first solvent from the metallic insert and replacing the first solvent with a rinsing solvent having a relatively low boiling point by rinsing the metallic insert in the rinsing solvent, and (d) drying the metallic insert to remove the rinsing solvent.

11. The method for removing any green sheet and metal-polymer composite paste residues from the metallic insert while maintaining the surface finish of the metallic insert, as claimed in claim 10, wherein the first solvent is an aromatic hydrocarbon and wherein the second solvent is an alkyl alcohol with six or fewer carbon atoms.

12. The method for removing any green sheet and metal-polymer composite paste residues from the metallic insert while maintaining the surface finish of the metallic insert, as claimed in claim 11, wherein the first solvent is selected from xylenes, terpenes, and methyl naphthalenes and the second solvent is isopropanol.

13. The method for removing any green sheet and metal-polymer composite paste residues from the metallic insert while maintaining the surface finish of the metallic insert, as claimed in claim 10, wherein step (a) precedes step (b) which precedes step (c).

14. The method for removing any green sheet and metal-polymer composite paste residues from the metallic insert while maintaining the surface finish of the metallic insert, as claimed in claim 10, wherein step (a) follows step (b) and precedes step (c).

15. The method for removing any green sheet and metal-polymer composite paste residues from the metallic insert while maintaining the surface finish of the metallic insert, as claimed in claim 10, wherein the rinsing solvent is the second solvent.

* * * * *